US010367469B2

(12) United States Patent
Kaajakari

(10) Patent No.: US 10,367,469 B2
(45) Date of Patent: Jul. 30, 2019

(54) CORNER COUPLING RESONATOR ARRAY

(71) Applicant: Murata Manufacturing Co., Ltd., Nagaokakyo-shi, Kyoto-fu (JP)

(72) Inventor: Ville Kaajakari, Altadena, CA (US)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 335 days.

(21) Appl. No.: 15/388,093

(22) Filed: Dec. 22, 2016

(65) Prior Publication Data
US 2018/0183403 A1    Jun. 28, 2018

(51) Int. Cl.
  *H03H 9/02*    (2006.01)
  *H03H 9/205*   (2006.01)
  *H03H 9/50*    (2006.01)
  *H03H 9/15*    (2006.01)
  *H03H 9/24*    (2006.01)

(52) U.S. Cl.
  CPC ........ *H03H 9/02433* (2013.01); *H03H 9/205* (2013.01); *H03H 9/505* (2013.01); *H03H 2009/02496* (2013.01); *H03H 2009/155* (2013.01); *H03H 2009/2442* (2013.01)

(58) Field of Classification Search
  CPC ............... H03H 9/02433; H03H 9/025; H03H 2009/2442; H03H 2009/155; H03H 9/505; H03H 2009/02496
  See application file for complete search history.

(56) References Cited

U.S. PATENT DOCUMENTS

| 5,548,180 A | 8/1996 | Kaida | |
| 8,786,166 B2 | 7/2014 | Jaakkola et al. | |
| 9,276,556 B1* | 3/2016 | Wu | H03H 9/462 |
| 2007/0001783 A1* | 1/2007 | Lutz | H03H 3/0076 |
| | | | 333/186 |
| 2008/0136563 A1* | 6/2008 | Duwel | H03H 9/0095 |
| | | | 333/186 |
| 2009/0153258 A1* | 6/2009 | Lutz | H03B 5/30 |
| | | | 331/156 |
| 2010/0060111 A1* | 3/2010 | Ayazi | H03B 5/326 |
| | | | 310/367 |
| 2012/0038431 A1 | 2/2012 | Jaakkola et al. | |
| 2013/0300521 A1* | 11/2013 | Khine | H03H 9/02228 |
| | | | 333/187 |

(Continued)

OTHER PUBLICATIONS

Bhave et al., "Fully-Differential Poly-SiC Lame Mode Resonator and Checkerboard Filter", 18th IEEE International Conference on Micro Electro Mechanical Systems, pp. 223-226 (2005).

(Continued)

*Primary Examiner* — Bryan P Gordon
(74) *Attorney, Agent, or Firm* — Arent Fox LLP

(57) ABSTRACT

A MEMS resonator array is provided with improved electrical characteristics and reduced motional impedance at high frequency applications. The MEMS resonator array includes a pair of first piezoelectric resonators that are opposed to each other with a space defined therebetween. Moreover, the MEMS resonator array includes a pair of second piezoelectric resonators that are opposed to each other and that are each coupled to respective corners of each of the first piezoelectric resonators. As such, each of the second piezoelectric resonators is partially disposed in the space defined between the pair of first piezoelectric resonators.

20 Claims, 12 Drawing Sheets

(56) References Cited

U.S. PATENT DOCUMENTS

2016/0065169 A1* 3/2016 Rinaldi ............... G01J 5/046
250/338.3

OTHER PUBLICATIONS

Clark et. al.; "Parallel-Coupled Square-Resonator Micromechanical Filter Arrays", IEEE International Frequency Control Symposium and Exposition, pp. 485-490 (2006).

* cited by examiner

CORNER COUPLING RESONATOR ARRAY

FIELD OF THE INVENTION

The present invention relates generally to MEMS resonator arrays, and, more particularly, to MEMS resonator arrays with corner coupling to minimize motional impedance in high frequency applications.

BACKGROUND OF THE INVENTION

Microelectromechanical system ("MEMS") resonators are small electromechanical structures that vibrate at high frequencies and are often used for timing references, signal filtering, mass sensing, biological sensing, motion sensing, and other applications. MEMS resonators are considered a common alternative to quartz timing devices to provide an accurate time or frequency reference. In general, quartz resonators have a high quality factor and piezoelectric coupling. High quality factor indicates a low rate of energy loss relative to the stored energy of the resonator, i.e., the oscillations die out more slowly. However, one limitation for quartz resonators is that they are difficult to design in smaller sizes.

Accordingly, MEMS resonators have been used as an alternative for devices and applications that are required to be smaller than available quartz resonators. Moreover, to maximize the quality factor, such MEMS resonators have been designed to resonate in a bulk mode where the resonator deforms mainly in the in-plane where the out-of-plane movement is minimized. In particular, it is desirable that out-of-plane bending modes of the resonator are avoided as these modes have low quality factors at high frequencies.

Furthermore, the resonance frequency of MEMS resonators is inversely related to the resonator width. Thus, to increase the resonant frequency of the resonator, device designs must reduce the width and length of the resonator accordingly. However, reducing the size of such resonators also results in higher electrical impedance, which is undesirable.

Some existing resonator designs have attempted to decrease the electrical impedance by providing an array of multiple resonators in parallel. For example, Non-Patent Document 1, identified below, demonstrates an array of coupled 10.7 MHz square plate resonators where the plates vibrate out-of-plane and are actuated with electrostatic transducers.

FIG. 1 illustrates a conventional micromechanical resonator array similar to the design disclosed in Non-Patent Document 1. As shown in FIG. 1, the resonator array 1 includes a plurality of resonator plates 10A that are respectively coupled by coupling beams 20A and 20B. However, for this design, due to electrostatic actuation and out-of-plane bending mode, the resonator array 1 is not satisfactory for frequencies higher than 20 MHz as the motional impedance would still be unacceptably high for most device implementations.

Furthermore, Non-Patent Document 2, identified below, discloses another conventional design that introduces an electrostatically actuated resonator array where the resonators are connected with a connection beam. The design disclosed in Non-Patent Document 2 also includes technical limitations as electrostatic actuation makes the motional impedance unacceptably high. Moreover, vibration of the coupling beams leads to many spurious resonances in the resonance response.

To minimize some of the limitations of the designs described above, many MEMS resonators will typically be made of silicon using lithography based manufacturing processes and wafer level processing techniques. However, because bare silicon is not piezoelectric and pure silicon resonators have high motional impedance, it has been found that adding a piezoelectric material, such as a layer of thin film of aluminum nitride (AlN), on top of the resonator yields a resonator with lower motional impedance. A typical piezoelectric MEMS resonator is shown in FIGS. 2A and 2B.

In particular, FIG. 2A illustrates a top view of a conventional width extensional resonator 10. As shown, resonator 10 is rectangular shaped (although other shapes have been used) with a lateral length L and width W. Moreover, resonator 10 includes two smalls anchor 11A and 11B on the sides of the resonator to mount the resonator.

FIG. 2B illustrates a cross sectional view of the conventional resonator 10. Typically, the resonator 10 is manufactured of silicon using MEMS manufacturing techniques. On top of silicon substrate 12, the resonator 10 has a piezoelectric thin film 16 sandwiched between two metal electrodes 14A and 14B to provide piezoelectric coupling. In an exemplary design, the metal electrodes 14A and 14B are typically molybdenum, but other materials such as platinum or aluminum may also be used. Moreover, the piezoelectric film 16 may be aluminum nitride (AlN) or doped aluminum nitride, but may also be PZT or titanium oxide.

As noted above, to maximize the quality factor of resonator 10, it is desirable that the resonator resonates in a bulk mode where the resonator deforms mainly in in-plane and the out-of-plane movement is minimized. In particular, it is desirable that out-of-plane bending modes of the resonator are avoided as these modes have low quality factors at high frequencies. Moreover, for the bulk vibration modes, the lateral resonator dimensions determine the resonator resonance frequency and are important in designing high quality factor resonators. A good design with a high quality factor has a rectangular shape with width W and length L as shown in FIG. 2A. The motion of the resonator 10 is mainly in the width direction and the resonator is referred to as the width-extensional resonator.

FIG. 2C illustrates a top view of the width extensional resonator 10 according to a conventional design in which the vibrational motion of the resonator 10 is mainly in the width direction (i.e., contraction and expansion vibration). This mode is preferred as the anchoring points 11A and 11B on the short side of the resonator have minimal movement, and, therefore, minimize the anchor losses and maximize the quality factor.

Referring back to FIG. 2A, it is also known that certain aspect ratios ("AR"), defined as the ratio of length L to width W (i.e., AR=L/W), minimize the mounting losses and therefore maximize the quality factor, for example, as described in Patent Document 1, identified below. In particular, an optimal aspect ratio ranges from 1.2 to 1.8 depending on material properties and is typically around 1.5 for silicon based resonators.

As further noted above, the resonance frequency is inversely related to the resonator width. However, small resonators with increased resonant frequencies also experience higher electrical impedance that is undesirable. Accordingly, some existing resonator designs combine multiple resonators in an array to lower the electrical impedance. For example, Patent Document 2, identified below, describes an in-plane mode resonator array where resonators are actuated with a piezoelectric transduced element that is arranged laterally between at least two resonator elements. However, the design disclosed in Patent Document 2 also experiences technical limitation in that by arranging the coupling to be laterally between the elements, additional vibrating elements are introduced that may disturb the resonator mode shape, resulting in an unsatisfactory frequency response.

Patent Document 1: U.S. Pat. No. 5,548,180.
Patent Document 2: U.S. Pat. No. 8,786,166.
Non-Patent Document 1: Clark et al., "Parallel-Coupled Square-Resonator Micromechanical Filter Arrays", IEEE International Frequency Control Symposium and Exposition, pp. 485-490 (2006).
Non-Patent Document 2: Bhave et al., "Fully-Differential Poly-SiC Lame Mode Resonator and Checkerboard Filter", 18th IEEE International Conference on Micro Electro Mechanical Systems, pp. 223-226 (2005).

SUMMARY OF THE INVENTION

Accordingly, the MEMS resonator array disclosed herein provides reduced motional impedance at high frequency applications while improving electrical characteristics such as drive level dependency.

Thus, according to one aspect, a MEMS resonator array is provided that includes at least a pair of first resonators opposed to each other with a space defined therebetween. Moreover, the MEMS resonator array includes at least a pair of second resonators that are opposed to each other and that are each coupled to respective corners of each of the first resonators, such that each of the second resonators is partially disposed in the space defined between the pair of first resonators.

In another aspect of the exemplary MEMS resonator array, a first side of a first resonator of the pair of first resonators is coupled at the respective corners to respective first sides of each of the second resonators, such that the first side of the first resonator overlaps with the respective first sides of the second resonators at a first pair of connecting regions.

In another aspect of the exemplary MEMS resonator array, a first side of a second resonator of the pair of first resonators is coupled at the respective corners to respective second sides of each of the second resonators with the second sides being opposite the first sides of the second resonators, such that the first side of the second resonator overlaps with the respective second sides of the second resonators at a second pair of connecting regions.

In another aspect of the exemplary MEMS resonator array, the first and second pairs of connecting regions comprise an overlapping distance between 1.0 μm and 20.0 μm.

In another aspect of the exemplary MEMS resonator array, the first and second pairs of connecting regions comprise a resonator overlap percentage of the respective sides of the resonators of 15% or less of a total length of each side of the respective resonator.

In another aspect of the exemplary MEMS resonator array, each of the first and second resonators comprises a rectangular shape with substantially equal lengths L and widths W.

In another aspect of the exemplary MEMS resonator array, each of the first and second resonators comprises a polygon shape having six corners.

In another aspect of the exemplary MEMS resonator array, the pair of second resonators are directly coupled to respective corners of each of the first resonators with overlapping connecting regions between adjacent resonators. Moreover, in this aspect, the overlapping connecting regions each comprise an overlapping distance between 1.0 μm and 20.0 μm. In addition or alternatively, the overlapping connecting regions comprise a resonator overlap percentage of the respective sides of the resonators of 15% or less of a total length of each side of the respective resonator.

In another aspect of the exemplary MEMS resonator array, the pair of second resonators are coupled to respective corners of each of the first resonators with respective filler pieces disposed between each of the coupled resonators.

In another aspect of the exemplary MEMS resonator array, the array further include at least one additional pair of resonators coupled to respective corners of one of the second resonator that are not coupled to the pair of first resonators.

According to a further embodiment, a MEMS resonator array is provided that includes at least a pair of first resonators each having a side surface extending parallel to each other in a first direction and facing each other with a space defined therebetween; and at least a pair of second resonators each having opposing first and second side surfaces parallel to each other and extending in the first direction. In this embodiment, each of the second resonators is coupled to respective opposing corners of the pair of first resonators, such that each of the second resonators is partially disposed in the space defined between the side surfaces of the pair of first resonators.

The above simplified summary of example embodiments serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and particularly pointed out in the claims.

BRIEF DESCRIPTION OF THE DRAWINGS

The accompanying drawings, which are incorporated into and constitute a part of this specification, illustrate one or more example embodiments of the present disclosure and, together with the detailed description, serve to explain their principles and implementations. The drawings provided are for illustrative purposes only and are therefore not drawn to scale.

DETAILED DESCRIPTION OF THE EXEMPLARY EMBODIMENTS

According to the exemplary embodiments described herein, MEMS resonator designs are provided to improve electrical characteristics by minimizing high motional impedance and drive level dependency that are observed in conventional MEMS designs in high frequency applications. In particular, the exemplary resonator arrays include a plurality of piezoelectric resonators that physically connect to each other for mechanical coupling as will be discussed in detail below.

Those of ordinary skill in the art will realize that the following description is illustrative only and is not intended to be in any way limiting. Other aspects will readily suggest themselves to those skilled in the art having the benefit of this disclosure. Reference will now be made in detail to implementations of the example aspects as illustrated in the accompanying drawings. The same reference indicators will be used to the extent possible throughout the drawings and the following description to refer to the same or like items.

Figure 3A:
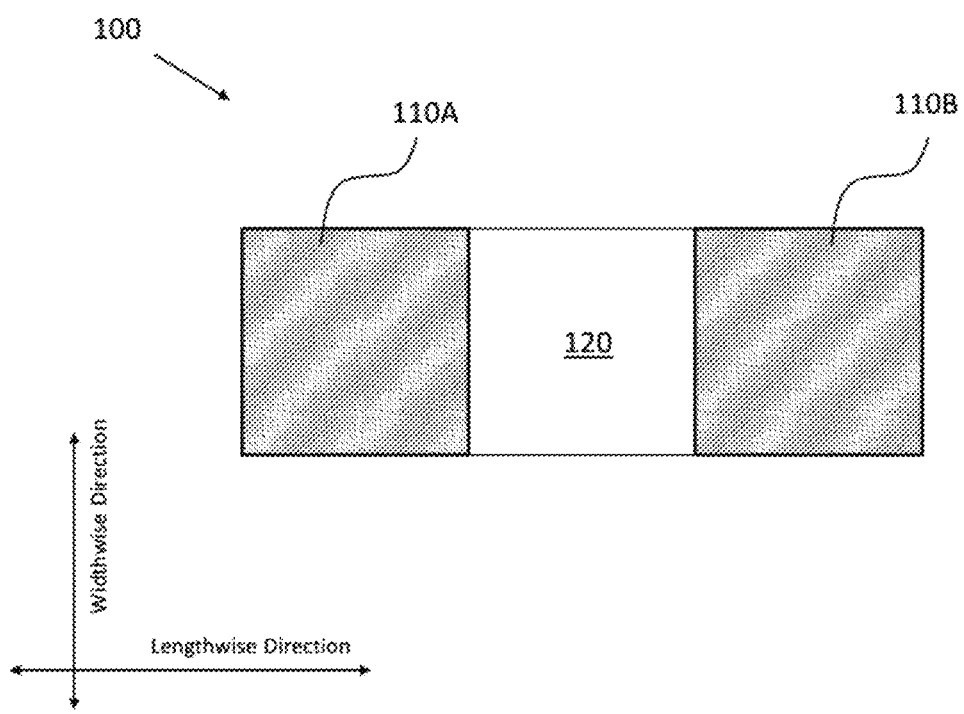
FIGS. 3A and 3B illustrate a MEMS resonator array according to an exemplary embodiment.
Figure 3B:
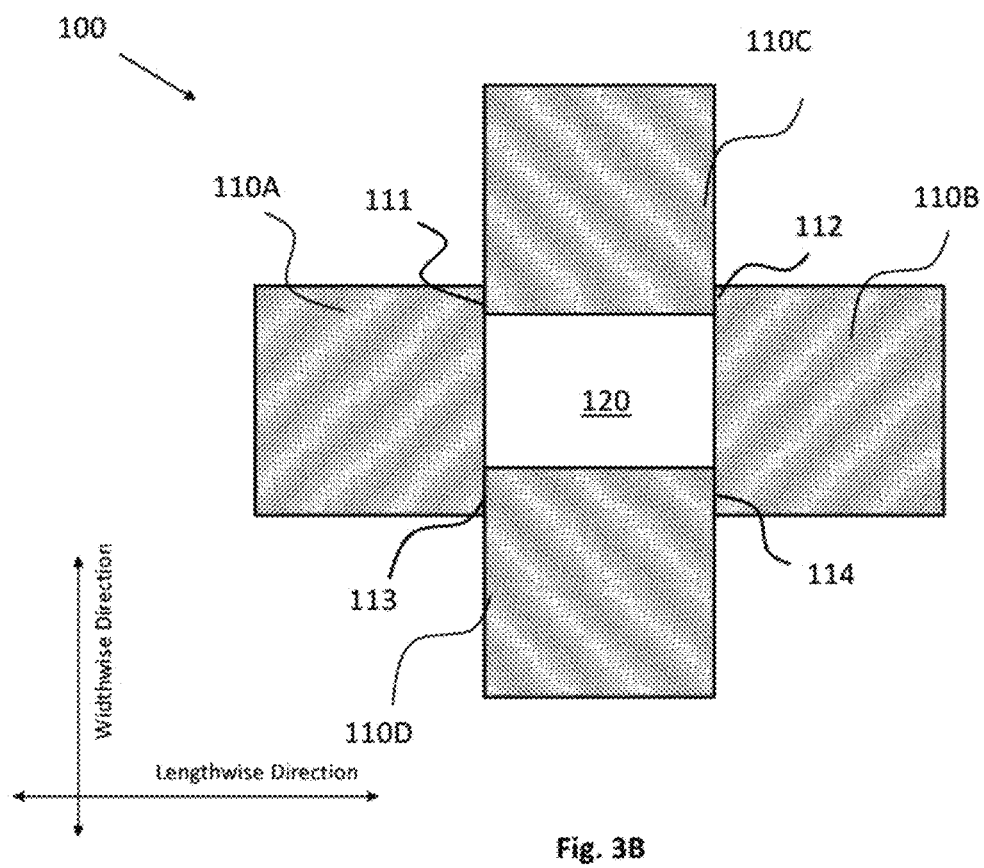

FIGS. 3A and 3B illustrate a MEMS resonator array according to an exemplary embodiment. In particular, FIG. 3A illustrates a top partial view of a MEMS resonator array 100 according to the exemplary embodiment. As shown, the resonator array 100 includes a first pair of piezoelectric resonators 110A and 110B (i.e., resonator plates) that are disposed in the same plane (i.e., in the lengthwise direction) with a space 120 (or region) disposed therebetween piezoelectric resonators 110A and 110B.

FIG. 3B illustrates a full top view of the MEMS resonator array 100 according to an exemplary embodiment. As shown, the MEMS resonator 100 is the same design configuration as shown in FIG. 3A having the first pair of piezoelectric resonators 110A and 110B with a space 120 disposed therebetween. As further shown, a second pair of piezoelectric resonators 110C and 110D are provided that are only partially disposed in the space 120 (i.e., region) between resonators 110A and 110B to form a mechanical connection between all four piezoelectric resonators 110A-110D.

Figure 2A:
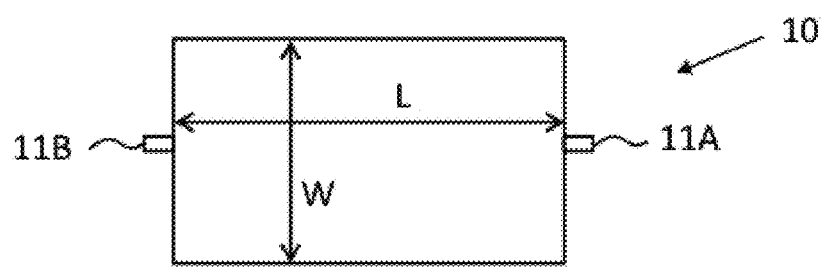
FIG. 2A illustrates a top view of a conventional width extensional resonator.
Figure 2B:
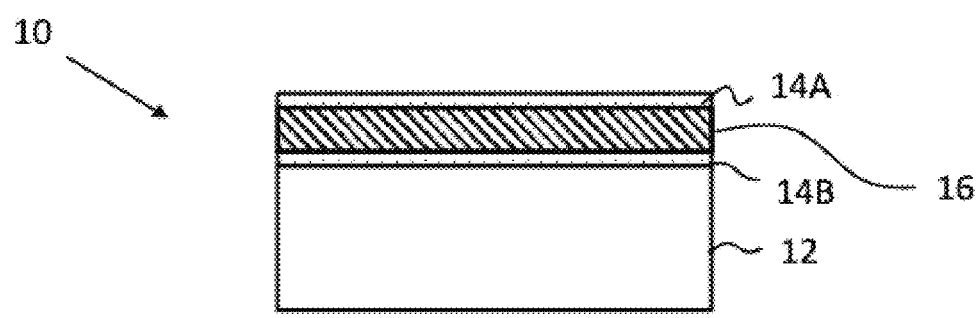
FIG. 2B illustrates a cross sectional view of the conventional resonator illustrated in FIG. 2A.
Figure 2C:
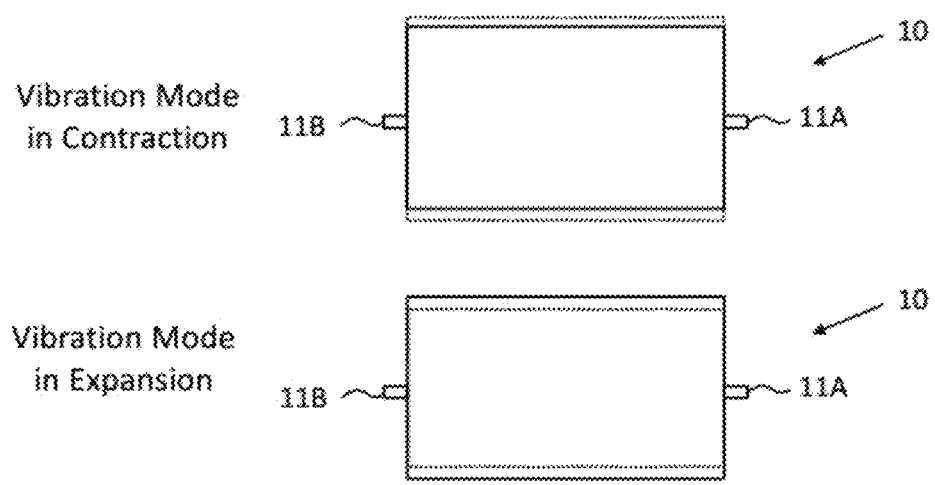
FIG. 2C illustrates a top view of the width extensional resonator shown in FIG. 2A and illustrating the vibrational motion.

In general, it is contemplated that each of the piezoelectric resonators 110A-110D can be processed from the same layer of an SOI wafer (i.e., the structural layer). Moreover, while not shown, each of the resonators 110A-110D can include a piezoelectric thin film sandwiched between two metal electrodes to provide piezoelectric coupling, such as the conventional layering described above with respect to FIG. 2B. The metal electrodes can be formed by molybdenum, platinum or aluminum, for example. Furthermore, the piezoelectric film may be aluminum nitride (AlN) or doped aluminum nitride, but may also be PZT or titanium oxide, for example. The piezoelectric resonators can be coupled in parallel using electrical connection configurations as would be appreciated to one skilled in the art, although the specific configuration is not critical to the exemplary MEMS resonator arrays and will not be described in further detail.

According to an exemplary embodiment, the thickness of the metal electrodes can be 50 nanometers (nm) to 400 nm, for example, and the thickness of the piezoelectric film can be 400 nm to 2 μm, for example. Furthermore, the thickness of the silicon substrate 12 may range from 3 μm to 30 μm, for example. Although not shown, additional thin film layers may also be present in some conventional designs. For example, a layer of silicon dioxide thin film can be used to change the temperature coefficient of frequency of the resonator.

As further shown in FIG. 3B, the piezoelectric resonators 110C and 110D are coupled to each piezoelectric resonators 110A and 110B, such that they partially overlap. More particularly, a first side of piezoelectric resonator 110A extending in the widthwise direction partially overlaps with first sides of each of piezoelectric resonators 110C and 110D extending in the same direction (i.e., the widthwise direction). For example, the overlapping of these resonators can be at connecting regions 111 and 113, respectively. Similarly, a first side of piezoelectric resonator 110B extending in the same widthwise direction partially overlaps with second sides (opposite the first sides) of each of piezoelectric resonators 110C and 110D at connecting regions 112 and 114, respectively.

As further shown, each of piezoelectric resonators 110A-110D preferably have the same or substantially the same or similar outer shape from the top view, which in this embodiment is a square shape. According to alternative embodiments, the piezoelectric resonators can have a rectangular outer shape as discussed below. With regard to the embodiment shown in FIG. 3B, it should be appreciated that the widthwise and lengthwise direction are only shown for relative perspective and can be reversed in this aspect since the outer shapes are square shapes and, therefore, the length and width is the same or substantially the same and are perpendicular with respect to each other.

In general, it is contemplated that the term "substantially" as is used herein takes into account minor variations in the resonator shape that may occur during the manufacturing process. For example, according to one embodiment, the piezoelectric resonators 110A-110D are designed to have identical or substantially identical dimensions. However, the machines used to deposit and etch the layers during the MEMS manufacturing process may lead to slight differences in these dimensions. Thus, the term "substantially" takes into account resulting variances in dimensions due to variations in the manufacturing equipment.

According to the exemplary embodiment, the partially overlapping mechanical connection between piezoelectric resonator 110A and each of piezoelectric resonators 110C and 110D as well as the partially overlapping mechanical connection between piezoelectric resonator 110B and each of piezoelectric resonators 110C and 110D is provided to ensure that all resonators 110A-110D vibrate at the same frequency. In this aspect, the exemplary overlapping distance is between 1.0 μm and 20.0 μm. Moreover, as shown, each resonator 110A-110D has a square outer shape, preferably with each side have a length of approximately 130 μm, for example. Using this overlapping connection between resonators, the MEMS resonator array 110 does not significantly affect the mode shape of the connected resonators 110A-110D from an application standpoint (including quality factor), but provides good mechanical coupling between the resonators and also facilitates the electrical connection using thin films on top of the resonators.

Figure 1:
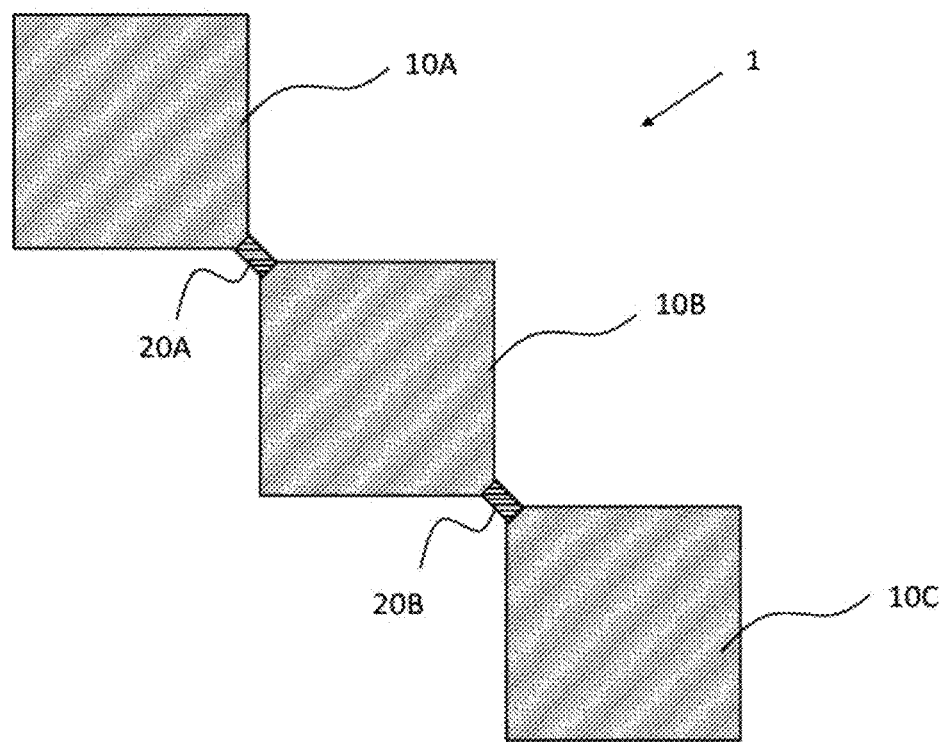
FIG. 1 illustrates a conventional piezoelectric micromechanical resonator array.

Moreover, when compared with conventional MEMS design, the exemplary MEMS resonator array 100 using piezoelectric resonators offers lower motional impedance than electrostatic resonators. Moreover, since piezoelectric resonators 110C and 110D are partially disposed in region 120 between resonators 110A and 110B, the overall resonator structure is very compact and unnecessary space between resonators is not wasted. Preferably, the overlapping region is as large as possible to reduce wasted space without reducing the electromechanical coupling coefficient below a required value required for effective device applications, as discussed below. In addition, since the piezoelectric resonators 110A-110D are only partially in contact with each other, the mode shape of individual resonators is not significantly altered. Finally, in the exemplary embodiment, the MEMS resonator array 110 does not require connecting beams (compare with FIG. 1, for example) between the individual resonators that unnecessarily increase the size of the array and introduce additional vibration modes, as described above with respect to conventional designs.

Figure 3C:
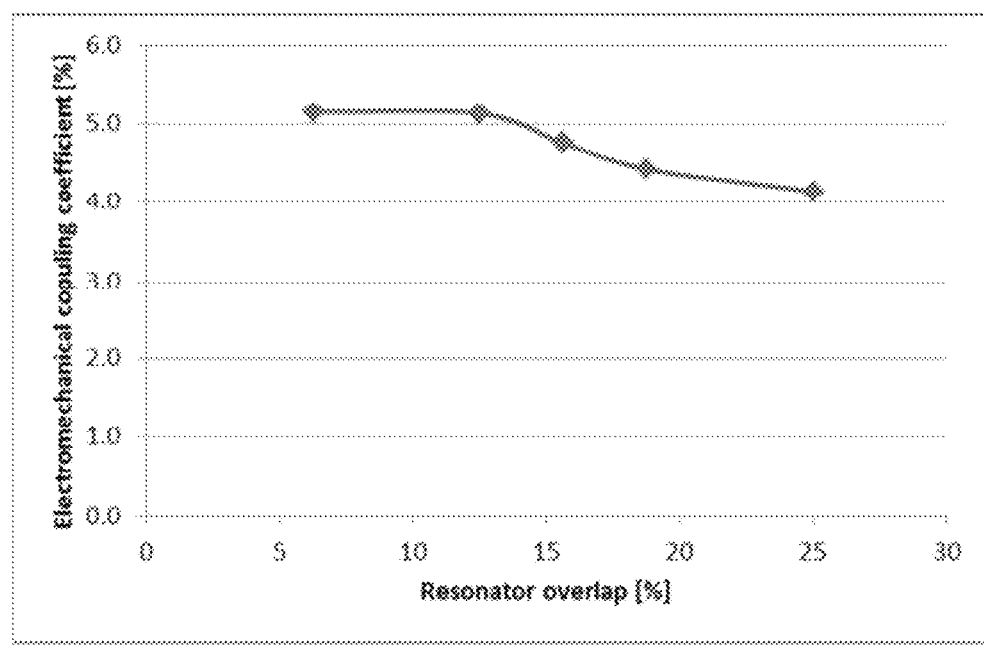
FIG. 3C illustrates a graph comparing the electromechanically coupling coefficient to resonator overlap percentage between two resonators of an exemplary MEMS resonator array as shown in FIG. 3B.

FIG. 3C illustrates a graph comparing the electromechanically coupling coefficient (in percentage) to resonator overlap (in percentage) between two of the resonators (e.g., resonators 110A and 110C) of an exemplary MEMS resonator array, such as the design shown in FIG. 3B. For the resonator overlap percentage, it should be appreciate that this percentage indicates the portion of the first side of resonator 110A that overlaps resonator 110C (or resonator 110D) in comparison to the total length of the side of the resonator 110A. Therefore, as an example, if resonator 110A has a side length of approximately 130 µm (extending in the widthwise direction) with an overlapping region of 20 µm with resonator 110C, for example, the resonator overlap will be approximately 15%. As shown in FIG. 3C, when the resonator overlap is greater than 15%, the electromechanical coupling coefficient drops below 5.0 and continues to decrease as the overlap percentage increases. Moreover, it is known to those skilled in the art that the drop in an electromechanical coupling coefficient indicates that the resonant mode shape has been disturbed and the mode shape of the array can no longer be described by the mode of individual resonators. The disturbed mode shape shows poor electromechanical coupling and lowered quality factor. Thus, according to the exemplary embodiment, each of the resonators (e.g., resonators 110A and 110B) in the MEMS resonator array 110 should overlap at a connecting region of the adjacent resonators (e.g., resonators 110C and 110D) at no more than 15% overlap to maintain effective resonant mode shape. At the same time, as noted above, the overlapping connecting region (e.g., each of regions 111, 112, 113 and 114) must be at least 1.0 µm to ensure good mechanical coupling between the resonators.

Figure 4A:
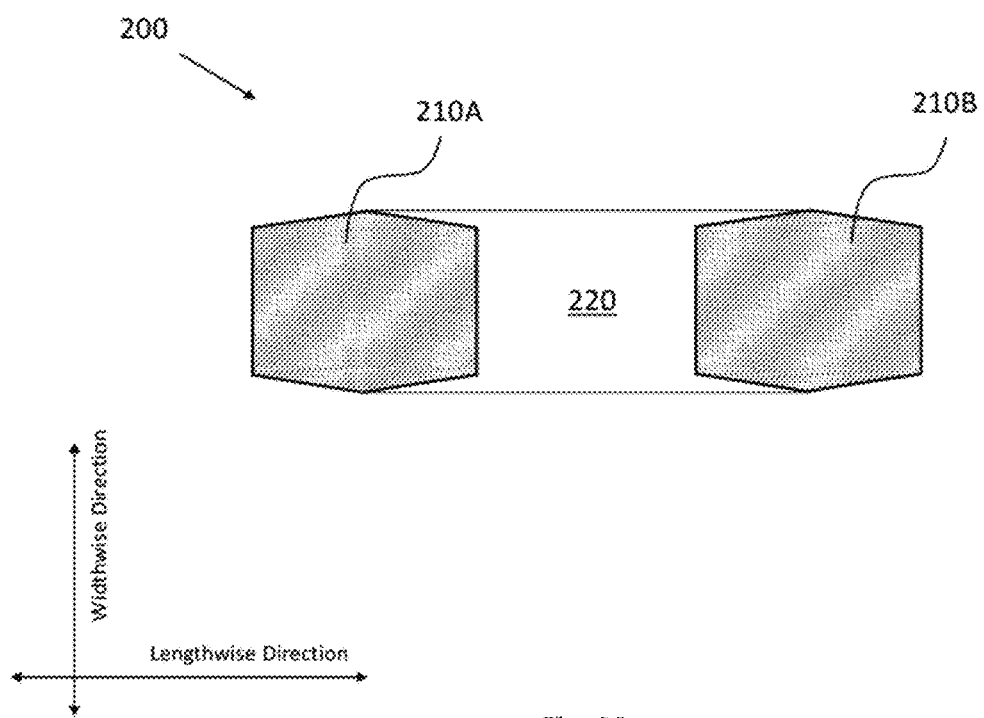
FIGS. 4A and 4B illustrate a MEMS resonator array according to another exemplary embodiment.
Figure 4B:
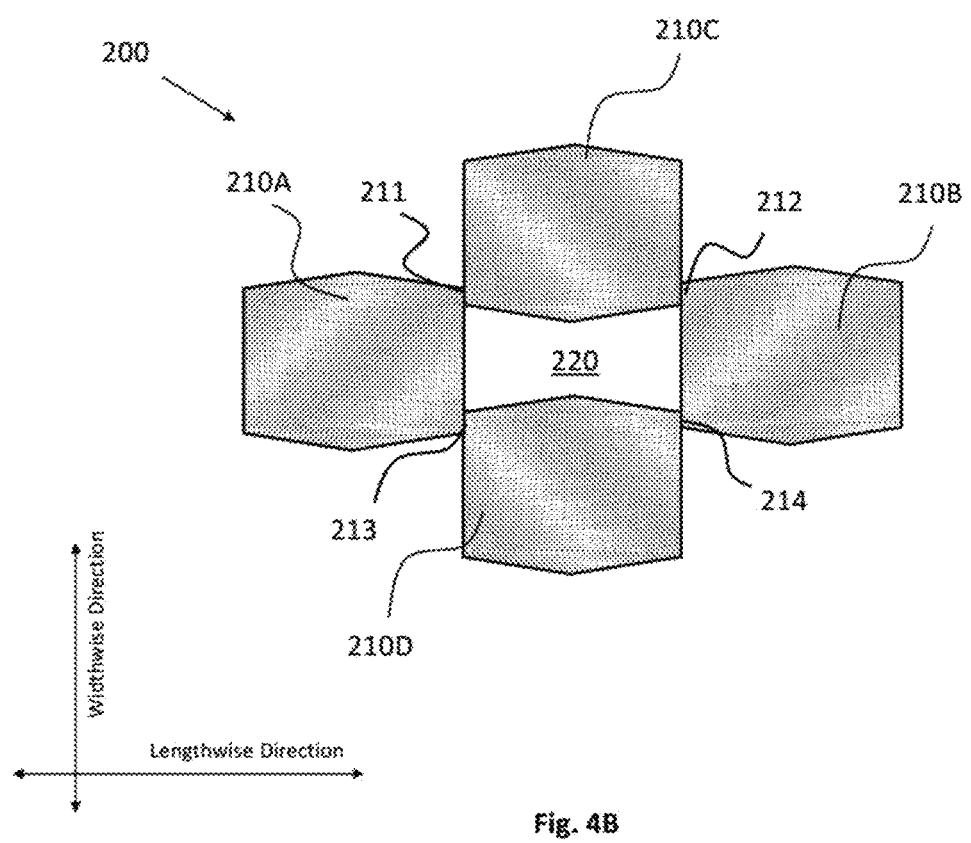

FIGS. 4A and 4B illustrate a MEMS resonator array according to another exemplary embodiment. In particular, FIG. 4A illustrates a partial top view of a MEMS resonator array 200 according to the exemplary embodiment. In particular, the resonator array 200 includes a first pair of piezoelectric resonators 210A and 210B that are disposed in the same plane (i.e., in the lengthwise direction) with a space 220 (or region) disposed therebetween piezoelectric resonators 210A and 210B. According to the exemplary embodiment, the outer shape of piezoelectric resonators 210A and 210B is a polygon with six corners.

FIG. 4B illustrates a full top view of a MEMS resonator array 200 according to an exemplary embodiment. As shown, the MEMS resonator 200 is the same design configuration as shown in FIG. 4A having the first pair of piezoelectric resonators 210A and 210B with a space 220 disposed therebetween. As further shown, a second pair of piezoelectric resonators 210C and 210D are only partially disposed in the space 220 (i.e., region) between resonators 210A and 210B to form a mechanical connection between all four piezoelectric resonators 210A-210D.

Thus, as shown, a first side of resonator 210A extending in the widthwise direction is connected at connecting regions 211 and 213 to first sides (also extending in the widthwise direction) of each of resonators 210C and 210D, respectively. Similarly, a first side of resonator 210B extending in the widthwise direction is connected at connecting regions 212 and 214 to second sides (parallel to and opposite the first sides) of each of resonators 210C and 210D, respectively. Similar to the exemplary MEMS resonator array 100 described above, the connecting regions 211-214 preferably extend for an overlapping distance between 1.0 µm and 20.0 µm with resonator overlap of no more than 15% (i.e., when the side surfaces are approximately 130 µm in the exemplary embodiment, for example). In view of the MEMS resonator 200 illustrated in FIG. 4B compared with the MEMS resonator 100 described above, it should be appreciated that resonators having different outer shaped (e.g., squares, polygons, and the like) can be implemented according to exemplary embodiments of the disclosure herein.

Figure 5A:
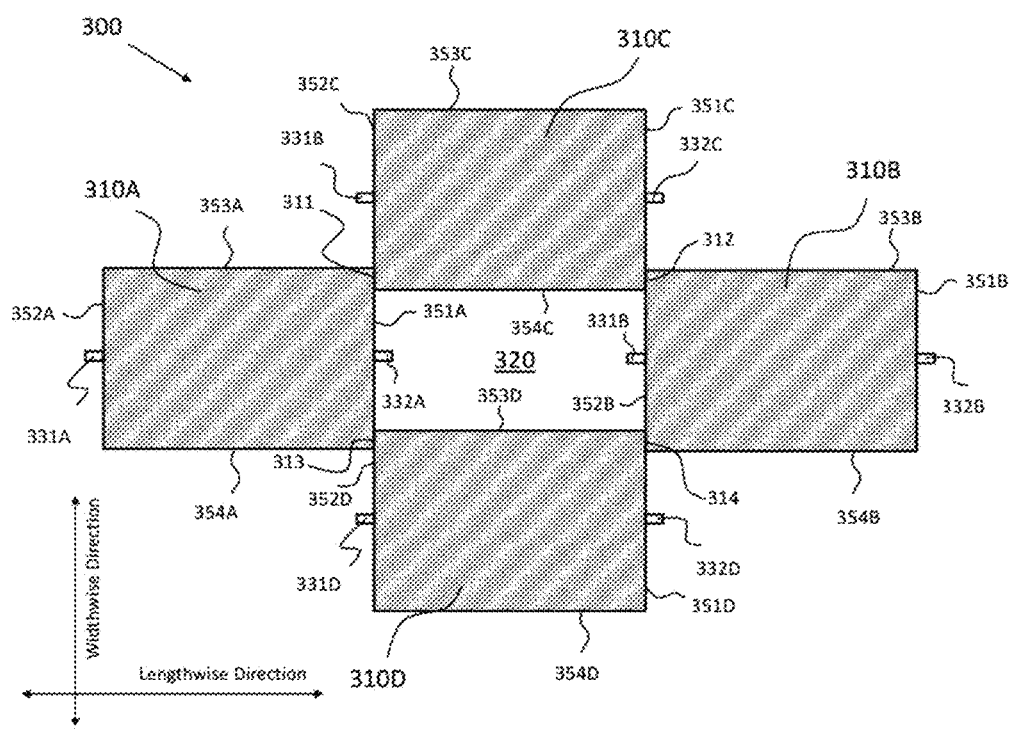
FIG. 5A illustrates a top view of MEMS resonator array according to yet another exemplary embodiment.

FIG. 5A illustrates a top view of MEMS resonator array according to yet another exemplary embodiment. As shown, the MEMS resonator array 300 includes a first pair of piezoelectric resonators 310A and 310B with a space or region 320 disposed therebetween and a second pair of piezoelectric resonators 310C and 310D partially disposed in the space 320 and coupled to resonators 310A and 310B at connecting regions 311, 312, 313 and 314, respectively.

As shown in this embodiment, each of the piezoelectric resonators 310A-310D comprises an outer rectangular shape with length L extending in the lengthwise direction and width W extending in the widthwise direction, where the lengths L are longer than the widths W. In particular, piezoelectric resonator 310A includes opposing short sides (i.e., first side 351A and second side 352A) that are parallel to each other and extending in the widthwise direction, and also includes opposing long sides (i.e., third side 353A and fourth side 354A) that are parallel to each other and extending in the lengthwise direction. Similarly, piezoelectric resonator 310B includes opposing short sides (i.e., first side 351B and second side 352B) that are parallel to each other and extending in the widthwise direction, and also includes opposing long sides (i.e., third side 353B and fourth side 354B) that are parallel to each other and extending in the lengthwise direction. Moreover, piezoelectric resonator 310C includes opposing short sides (i.e., first side 351C and second side 352C) that are parallel to each other and extending in the widthwise direction, and also includes opposing long sides (i.e., third side 353C and fourth side 354C) that are parallel to each other and extending in the lengthwise direction. Finally, piezoelectric resonator 310D includes opposing short sides (i.e., first side 351D and second side 352D) that are parallel to each other and extending in the widthwise direction, and also includes opposing long sides (i.e., third side 353D and fourth side 354D) that are parallel to each other and extending in the lengthwise direction.

In the exemplary aspect, short side 351A of resonator 310A and short side 352B of resonator 310B face each other with the space 320 defined therebetween. Similarly, long side 354C of resonator 310C and long side 353D of resonator 310D face each other with the space 320 defined therebetween.

As further shown, each resonator 310A-310D includes anchoring points that can be physically coupled to a frame (i.e., a support member) of the sensor device (not shown), such that the MEMS resonators are disposed in a cavity therein, as would be appreciated to one skilled in the art. Thus, as shown, resonator 310A includes anchoring points 331A and 332A, resonator 310B includes anchoring points 331B and 332B, resonator 310C includes anchoring points 331C and 332C, and resonator 310D includes anchoring points 331D and 332D. Preferably, these are nodal points of vibration expansion in the width expansion mode. Thus, as shown, the respective anchoring points are positioned at the center of each major surface of resonators 310A-310D, respectively, and at central portions of the respective shorter sides (i.e., in the widthwise direction) of the resonators 310A-310D. It is noted that the other MEMS resonator arrays (e.g., arrays 100 and 200) disclosed herein can also include such anchoring points, but are not illustrated as such so as to not unnecessarily obscure the aspects of the exemplary embodiments.

According to an exemplary aspect in FIG. 5A, the aspect ratio of lengths and widths of resonators 310A-310D are chosen to obtain a width extensional mode shape that minimizes the motion near anchor area. For example, as described above, an optimal aspect ratio ranges from 1.2 to 1.8 depending on material properties and is typically around 1.5 for silicon based resonators. Thus, in this aspect, the length L of each of resonators 310A to 310D (i.e., the length in the lengthwise direction) can be 1.5 times the length of widths W (i.e., the length in the widthwise direction).

Moreover, according to this embodiment, the piezoelectric resonators 310A-310D are aligned to connect along the short edge in order to minimize the disturbance of coupling on resonator mode shape similar to the embodiment of FIG. 3B described above. Thus, a first side 351A of resonator 310A extending in the widthwise direction partially overlaps with each of resonators 310C and 310D along sides 352C and 352D, respectively, at connecting regions 311 and 313. Moreover, the overlapping length at these connecting regions 311 and 313 preferably extends for a distance between 1.0 μm and 20.0 μm with resonator overlap of no more than 15% to maintain effective resonant mode shape and also ensure sufficient mechanical coupling between the resonators. Similarly, a side 352B of resonator 310B extending in the widthwise direction partially overlaps with each of resonators 310C and 310D along sides 351C and 351D (opposite to sides 352 and 352D, respectively) at connecting regions 312 and 314, respectively. Moreover, the overlapping length at these connecting regions 312 and 314 also preferably extends for a distance between 1.0 μm and 20.0 μm with resonator overlap of no more than 15% to maintain effective resonant mode shape and also ensure sufficient mechanical coupling between the resonators. Thus, as shown, the MEMS resonator array 300 includes a symmetrical outer shape from both the lengthwise perspective and widthwise perspective.

Figure 5B:
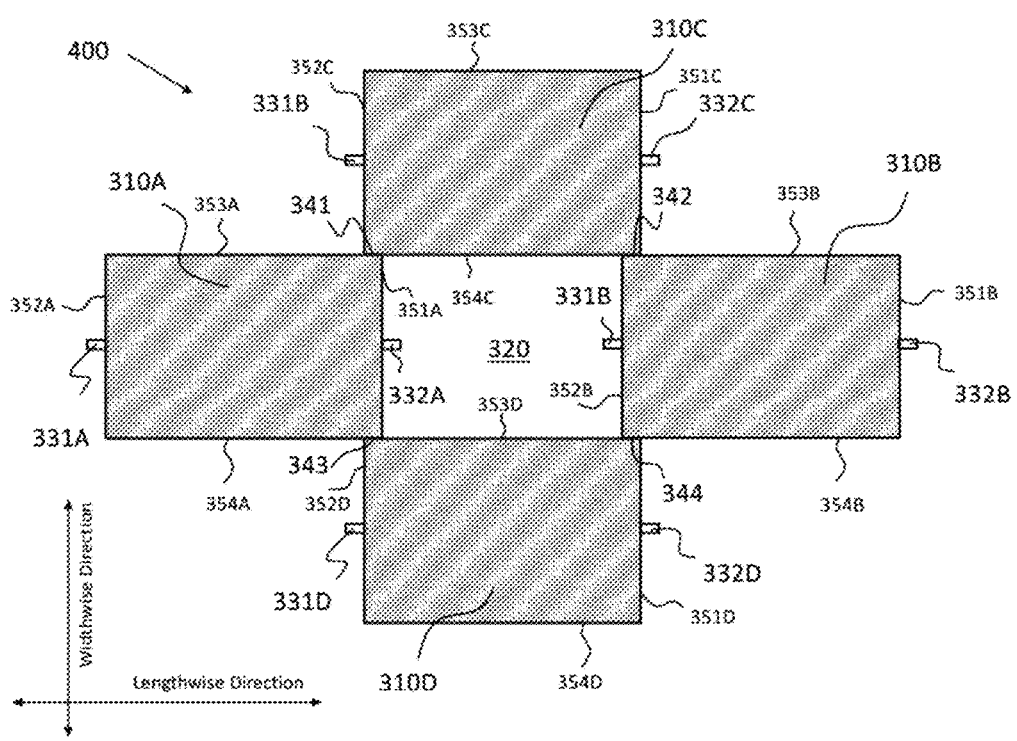
FIG. 5B illustrates a top view of a variation of the MEMS resonator array shown in FIG. 5A.

FIG. 5B illustrates a top view of a variation of the MEMS resonator array 300 shown in FIG. 5A. In particular, many of the components of MEMS resonator 400 are substantially the same as MEMS resonator array 300 and will not be repeated herein. The main variation is that in FIG. 5A, the long sides of piezoelectric resonators 310C and 310D are disposed in the space 320 between piezoelectric resonators 310A and 310B. In contrast, as shown in FIG. 5B, the short sides (i.e., sides 351A and 352B) of piezoelectric resonators 310A and 310B are disposed in the space 320 that is between piezoelectric resonators 310C and 310D.

Thus, as shown, the connecting regions 341, 342, 343 and 344 are at corners and overlap regions of the long sides of each of the rectangular shaped resonators 310A-310D rather than the short sides as shown in FIG. 5A. Otherwise, MEMS resonator 400 has a similar design as MEMS resonator 300 including having preferably the same aspect. Moreover, for both embodiments, the connecting regions (i.e., either regions 311-314 for array 300 or regions 341-344 for array 400) preferably extend for an overlapping distance between 1.0 μm and 20.0 μm with resonator overlap of no more than 15%.

Figure 6:
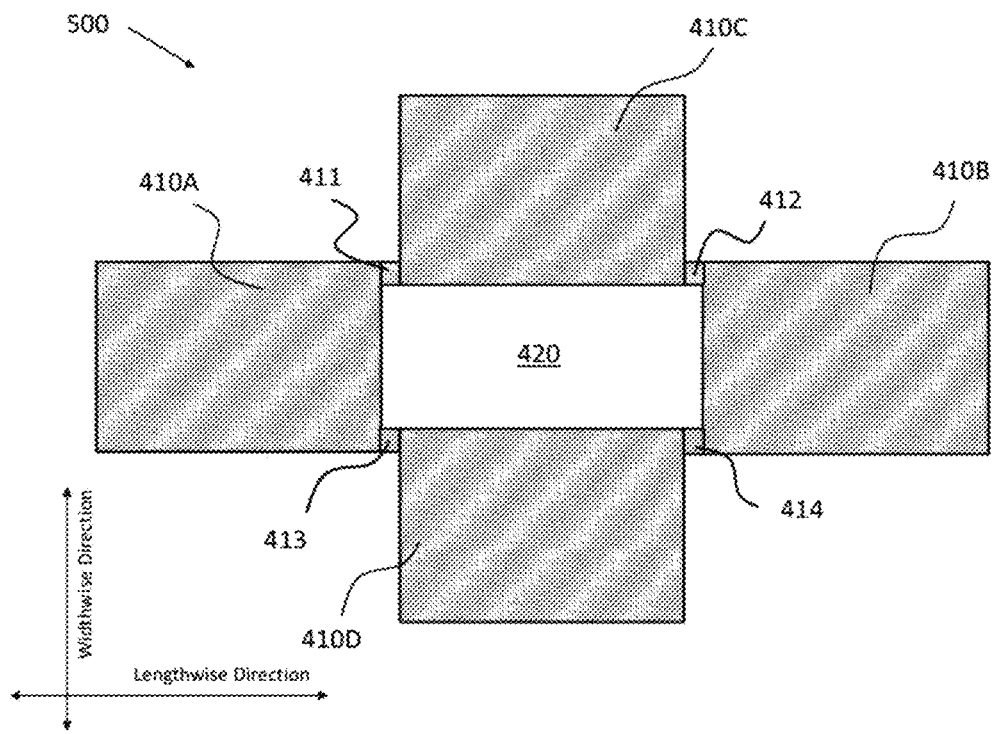
FIG. 6 illustrates a top view of a MEMS resonator array according to another embodiment.

FIG. 6 illustrates a top view of a MEMS resonator array 500 according to another embodiment. The design shown in FIG. 6 is similar to the MEMS resonator array 300 discussed above. In particular, the MEMS resonator array 500 includes four rectangular shaped resonators 410A-410D coupled to each other at corner regions. However, as further shown filler pieces 411, 412, 413 and 414 are used to connect the respective resonators to each other. In one aspect, the filler pieces can be using the same silicon or other substrate material used to manufacture the resonators. In this regard, the overlapping region will still be the same, meaning that, for example, resonator 410A will overlap in the lengthwise direction with each of resonators 410C and 410D at a distance between 1.0 μm and 20.0 μm with resonator overlap of no more than 15%. However, in this aspect, the resonators are not directly coupled to each, but instead filler pieces 411-414 are provided to couple the resonators to each other.

Finally, it should be appreciated that while each of the MEMS resonators arrays comprises four resonators as part of the array, the designs described herein can be modified such that each array can be extended to an arbitrarily large size with a resonator partially placed in the region between two other resonators.

Figure 7:
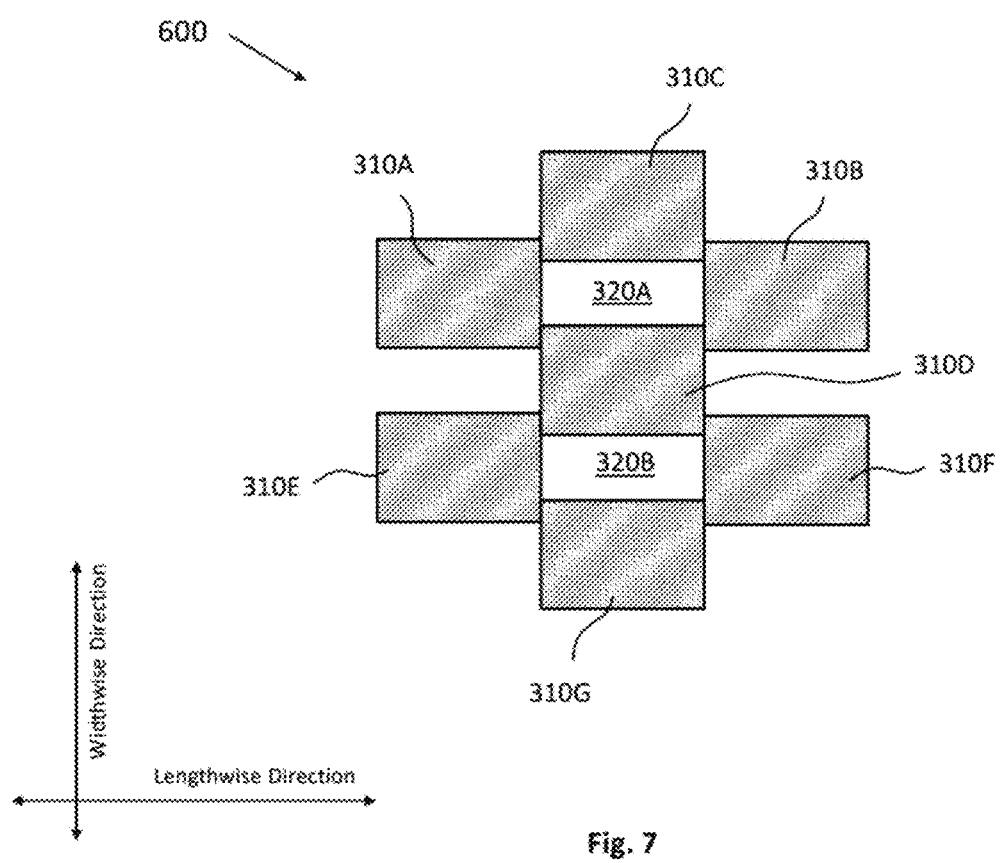
FIG. 7 illustrates a MEMS resonator array according to an alternative embodiment that illustrates the proposed extension of the exemplary design.

FIG. 7 illustrates a MEMS resonator array according to an alternative embodiment that highlights the proposed extension of the exemplary design. For example, the MEMS resonator array 600 can be a modification of array 300 shown in FIG. 5A and described above. In particular, the MEMS resonator array 600 includes resonators 310A, 310B, 310C and 310D with a space 320A disposed therebetween as described above. As further shown, resonators 310E and 310F are partially corner coupled to resonator 310D with resonator 310G partially disposed in the space 320B between resonators 310E and 310F. It should be appreciated that additional resonators can be added to array 600 in both the lengthwise and widthwise directions building a MEMS resonator array to have an arbitrarily large size to further reduce motional impedance, for example. Moreover, the MEMS resonator array 600 preferably has an overall symmetrical shape from the vertical axis of the device in both the lengthwise and the widthwise directions.

In the interest of clarity, not all of the routine features of the embodiments are disclosed herein. It should be appreciated that in the development of any actual implementation of the present disclosure, numerous implementation-specific decisions must be made in order to achieve the designer's specific goals, and these specific goals will vary for different implementations and different designers. It is understood that such a design effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by those skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

While the foregoing has been described in conjunction with exemplary embodiments, it is understood that the term "exemplary" is merely meant as an example. Accordingly, the application is intended to cover alternatives, modifications and equivalents, which may be included within the spirit and scope of the MEMS resonator disclosed herein.

REFERENCE SIGNS LIST 100, 200, 300, 400, 500, 600: MEMS Resonator Arrays
120, 220, 320, 420, 320A, 320B: Space
110A-110D, 210A-210D, 310A-310G, 410A-410D: Resonators
331A-331D, 332A-332D: Anchoring points
111-114, 211-214, 311-314, 341-344: Connecting Regions
351A-351D, 352A-352D: Short Sides of Resonators
353A-353D, 354A-354D: Long Sides of Resonators
411-414: Filler pieces

What is claimed:

1. A microelectromechanical system ("MEMS") resonator array comprising:
    at least a pair of first piezoelectric resonators opposed to each other with a space defined therebetween; and
    at least a pair of second piezoelectric resonators that are opposed to each other and that are each coupled to respective corners of each of the first piezoelectric resonators, such that each of the second piezoelectric resonators is partially disposed in the space defined between the pair of first piezoelectric resonators,
    wherein each piezoelectric resonator of the respective pairs of first and second piezoelectric resonators comprise a pair of anchoring points on respective opposing sides of each piezoelectric resonator, such that each piezoelectric resonator is configured to vibrate in-plane in a width expansion mode.

2. The MEMS resonator array according to claim 1, wherein a first side of a first piezoelectric resonator of the pair of first piezoelectric resonators is coupled at the respective corners to respective first sides of each of the second piezoelectric resonators, such that the first side of the first piezoelectric resonator overlaps with the respective first sides of the second piezoelectric resonators at a first pair of connecting regions.

3. The MEMS resonator array according to claim 2, wherein a first side of a second piezoelectric resonator of the pair of first piezoelectric resonators is coupled at the respective corners to respective second sides of each of the second piezoelectric resonators with the second sides being opposite the first sides of the second piezoelectric resonators, such that the first side of the second piezoelectric resonator overlaps with the respective second sides of the second piezoelectric resonators at a second pair of connecting regions.

4. The MEMS resonator array according to claim 3, wherein the first and second pairs of connecting regions comprise an overlapping distance between 1.0 μm and 20.0 μm.

5. The MEMS resonator array according to claim 3, wherein the first and second pairs of connecting regions comprise a resonator overlap percentage of the respective sides of the resonators of 15% or less of a total length of each side of the respective resonator.

6. The MEMS resonator array according to claim 1, wherein each of the first and second piezoelectric resonators comprises a rectangular shape with substantially equal lengths L and widths W.

7. The MEMS resonator array according to claim 1, wherein each of the first and second piezoelectric resonators comprises a polygon shape having six corners.

8. The MEMS resonator array according to claim 1, wherein the pair of second piezoelectric resonators are directly coupled to respective corners of each of the first piezoelectric resonators with overlapping connecting regions between adjacent resonators.

9. The MEMS resonator array according to claim 8, wherein the overlapping connecting regions each comprise an overlapping distance between 1.0 μm and 20.0 μm.

10. The MEMS resonator array according to claim 8, wherein the overlapping connecting regions comprise a resonator overlap percentage of the respective sides of the resonators of 15% or less of a total length of each side of the respective resonator.

11. The MEMS resonator array according to claim 1, wherein the pair of second piezoelectric resonators are coupled to respective corners of each of the first piezoelectric resonators with respective filler pieces disposed between each of the coupled resonators.

12. The MEMS resonator array according to claim 1, further comprising at least one additional pair of piezoelectric resonators coupled to respective corners of one of the second piezoelectric resonator that are not coupled to the pair of first piezoelectric resonators.

13. A microelectromechanical system ("MEMS") resonator array comprising:
    at least a pair of first piezoelectric resonators each having a side surface extending parallel to each other in a first direction and facing each other with a space defined therebetween; and
    at least a pair of second piezoelectric resonators each having opposing first and second side surfaces parallel to each other and extending in the first direction,
    wherein each of the second piezoelectric resonators is coupled to respective opposing corners of the pair of first piezoelectric resonators, such that each of the second piezoelectric resonators is partially disposed in the space defined between the side surfaces of the pair of first piezoelectric resonators,
    wherein each piezoelectric resonator of the respective pairs of first and second piezoelectric resonators comprise a pair of anchoring points on respective opposing sides thereof, such that each piezoelectric resonator is configured to vibrate in-plane in a width expansion mode.

14. The MEMS resonator array according to claim 13, wherein each of the first and second piezoelectric resonators comprises a rectangular shape with substantially equal lengths L and widths W, wherein the lengths L are longer than the widths W.

15. The MEMS resonator array according to claim 14, wherein the side surface of each of the first piezoelectric resonators and the first and second side surfaces of each of the second piezoelectric resonators correspond to short sides of the rectangular shape having a length equal to width W.

16. The MEMS resonator array according to claim 14, wherein the side surface of each of the first piezoelectric resonators and the first and second side surfaces of each of the second piezoelectric resonators correspond to long sides of the rectangular shape having a length equal to length L.

17. The MEMS resonator array according to claim 13, wherein the pair of second piezoelectric resonators are directly coupled to respective corners of each of the first piezoelectric resonators with overlapping connecting regions between adjacent resonators.

18. The MEMS resonator array according to claim 17, wherein the overlapping connecting regions each comprise an overlapping distance between 1.0 µm and 20.0 µm.

19. The MEMS resonator array according to claim 17, wherein the overlapping connecting regions comprise a resonator overlap percentage of the respective sides of the resonators of 15% or less of a total length of each side of the respective resonator.

20. The MEMS resonator array according to claim 13, wherein the pair of second piezoelectric resonators are coupled to respective corners of each of the first piezoelectric resonators with respective filler pieces disposed between each of the coupled resonators.

* * * * *